DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JANUARY 27, 1970

870 O.G. 1064

T870,022

COMPOSITE LITHOGRAPHIC ELEMENT AND LITHOGRAPHIC PLATE MADE THEREFROM

David Walter Kenyon and William S. Miller, both of Kodak Park, Rochester, N.Y. 14650

Filed Aug. 22, 1969, Ser. No. 852,460

Int. Cl. G03f *7/02;* G03c *1/76, 1/68*

U.S. Cl. 96—33

No Drawing. 14 Pages Specification

This invention relates to an improved composite lithographic element and an improved presensitized lithographic printing plate prepared therefrom which may be camera or contact speed, positive or negative working. The composite lithographic element comprises a support with a hydrophilic surface, said surface bearing three additional layers which, in order starting from the layer nearest said hydrophilic surface, comprise (A) a bottom layer containing a light sensitive organic soluble polymer suitable for use in presensitized lithographic plates, e.g. a light sensitive polycarbonate resin, (B) an intermediate sub-layer e.g. a gelatin-cellulose nitrate subbing or a gelatin-sodium silicate subbing, and (C) a top layer containing a light sensitive emulsion, e.g. a silver halide emulsion, wherein the intermediate sub-layer establishes an adherent bond between the bottom and the top layer, is photographically inactive, and readily releases from the bottom layer in the presence of organic processing chemicals used in the development of the light sensitive polymer.